US006664830B2

(12) United States Patent
Miller

(10) Patent No.: US 6,664,830 B2
(45) Date of Patent: Dec. 16, 2003

(54) LOW PASS FILTERS IN DLL CIRCUITS

(75) Inventor: James E. Miller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/997,721

(22) Filed: Nov. 30, 2001

(65) Prior Publication Data

US 2003/0102895 A1 Jun. 5, 2003

(51) Int. Cl.[7] .................................................. H03L 7/08
(52) U.S. Cl. ........................................ 327/158; 327/156
(58) Field of Search ................................. 327/156, 158, 327/105, 141; 341/136

(56) References Cited

U.S. PATENT DOCUMENTS 5,748,125 A * 5/1998 Cederbaum et al. ........ 341/136
6,069,506 A    5/2000 Miller, Jr. et al. .......... 327/156
6,388,480 B1 * 5/2002 Stubbs et al. ............... 327/156

* cited by examiner

Primary Examiner—Dinh T. Le
(74) Attorney, Agent, or Firm—Fish & Neave; Garry J. Tuma; Angeline J. Huang

(57) ABSTRACT

Circuits and methods are provided that reduce, if not prevent, the adverse effects of transient noise on phase adjustments made by digital delay lock loop (DLL) circuits, which typically generate a periodic output signal having a particular phase relationship with a periodic input signal. A digital low pass filter of a DLL circuit includes circuitry, such as, for example, a thermometer register, coupled to receive the outputs of a DLL phase detector. The low pass filter prevents the DLL circuit from making frequent changes to the phase of the DLL output signal.

35 Claims, 6 Drawing Sheets

LOW PASS FILTERS IN DLL CIRCUITS

BACKGROUND OF THE INVENTION

This invention relates to digital DLL (delay lock loop) circuits. More particularly, this invention relates to low pass filters in digital delay lock loop circuits.

Digital delay lock loop circuits typically generate a clock signal based on a periodic reference signal (e.g., from an oscillator) that maintains a specific phase relationship with that reference signal. Digital delay lock loop circuits are often used, for example, in high-speed clocked memories such as SDRAMs (synchronous dynamic random access memories).

A digital delay lock loop circuit usually includes a phase detector that detects a phase difference outside the specified phase relationship between the periodic reference signal and the periodic output signal, which is fed back to the phase detector. The phase detector provides a "shift" signal, if necessary, to adjust the phase of the output signal. Such shift signals cause the delay between output signal transitions and corresponding reference signal transitions to increase or decrease as needed to reestablish the specified phase relationship.

However, phase detectors may erroneously provide shift signals in response to noise on the phase detector inputs, rather than in response to an actual phase difference between the reference signal and the output signal. This can cause errors in the output signal. For example, transient noise in a delay lock loop circuit may cause the output signal to unnecessarily shift even though the output signal is tracking the reference signal accurately. After the output signal shifts, it may no longer be within the specified phase relationship with the reference signal. This can cause logic errors in cases where, for example, the output signal is a clock signal shifted out of specification. Moreover, the transient noise is likely to disappear, resulting in the output signal shifting again. At the least, typical delay lock loop circuits can unnecessarily disturb an output signal.

A known solution is to couple a digital low pass filter to the output of the phase detector to prevent shifts caused by high frequency noise from propagating through to the output signal. However, these filters become relatively large and cumbersome as the low pass frequency is lowered, and thus, are not always practical.

In view of the foregoing, it would be desirable to provide a digital delay lock loop circuit having a versatile, compact low pass filter that reduces, if not prevents, the adverse effects of input noise.

SUMMARY OF THE INVENTION

It is an object of this invention to provide a digital delay lock loop circuit having a versatile, compact low pass filter that reduces, if not prevents, the adverse effects of input noise.

The invention provides an arbitrarily low, low pass filter for delay lock loop circuits. The filter preferably includes a thermometer register. Alternatively, the filter can include other circuitry that performs the same or equivalent function as the thermometer register (described below). Such alternative circuitry can include, for example, appropriately configured averaging circuits, appropriately configured counters or accumulators, etc.

The low pass filter is coupled to receive the outputs of a phase detector. The phase detector provides signals that indicate whether the periodic output signal leads or lags a periodic input reference signal outside a predetermined phase relationship. The low pass filter filters these phase detector signals, which may be caused by noise, and outputs shift signals as appropriate. The shift signals are fed to a variable-delay buffer that provides buffered versions of the input reference signal at selectable delay points.

In one embodiment of the invention, the low pass filter includes a thermometer register that has a most significant portion initialized to all logical ones or zeroes, and a least significant portion initialized to all logical zeroes or ones, respectively. The logical ones and zeros represent leading and lagging signals, respectively, or vice-versa. The thermometer register provides shift signals in response to having all logical ones or all logical zeroes. Based on the lead or lag signals received from the phase detector, the thermometer register shifts left or right, respectively, or vice-versa, shifting in a one or zero as appropriate. The thermometer register fills with all ones or all zeroes after a net number of shifts to the right or left, indicating that detection of a leading or lagging output signal a net number of times more than a lagging or leading output signal, respectively, has occurred. Thus, the thermometer register advantageously filters sudden and transient changes in phase difference as detected by the phase detector—differences which may have been caused by noise.

The arbitrarily low, low pass aspect of the filter results from the scalability of the thermometer register to any size (i.e., number of bits). The larger the thermometer register, the lower the passing frequency allowed by the thermometer register and thus, the more likely that detected phase differences will not be caused by noise.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
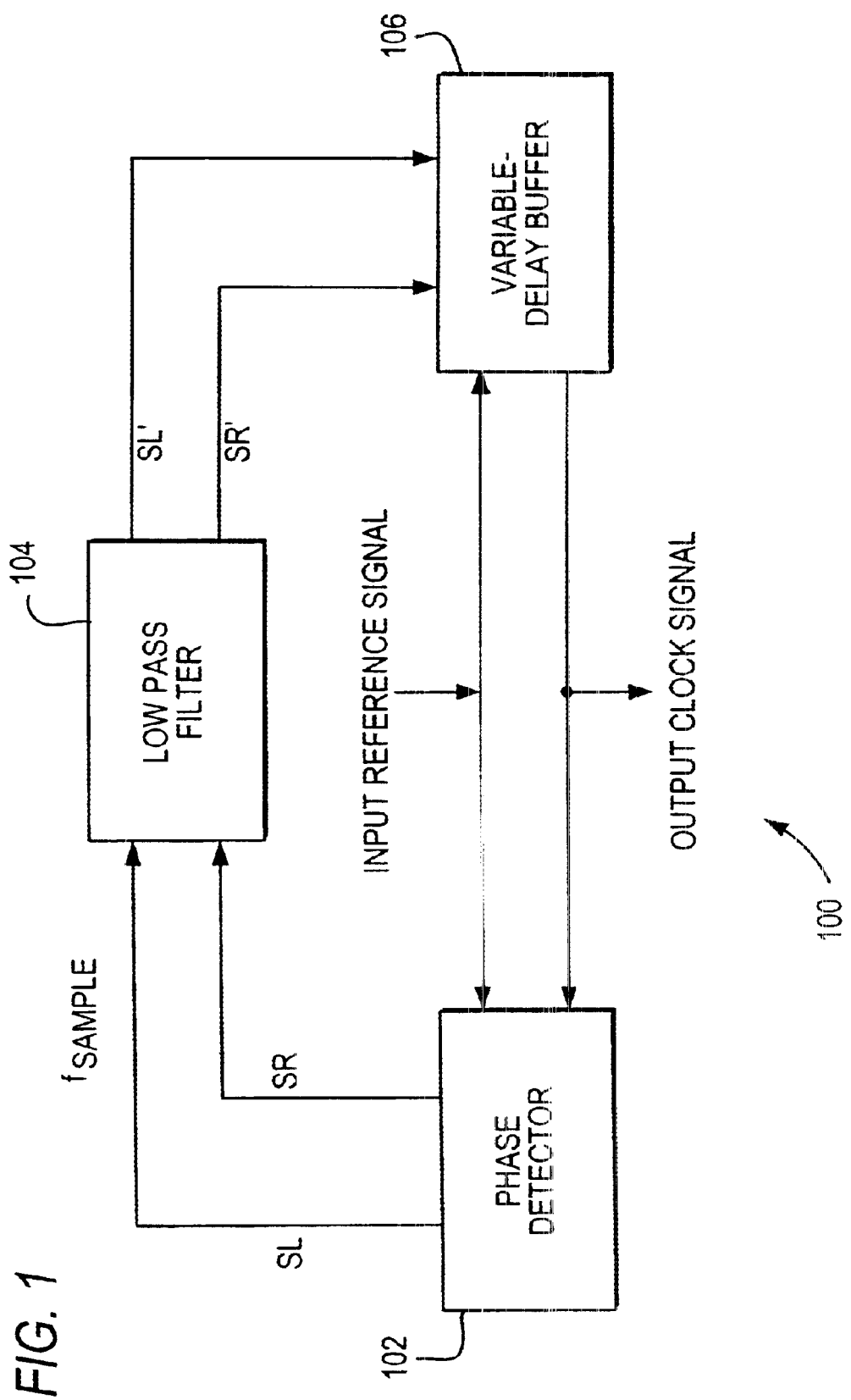
FIG. 1 is a high-level block diagram of a preferred embodiment of a delay lock loop circuit according to the invention.

The invention better maintains the phase relationship between periodic input signals and periodic output signals generated by digital delay lock loop (DLL) circuits. DLL circuits of the invention include a low pass filter that preferably includes a thermometer register. The thermometer register prevents the DLL phase detector, which detects the phase difference between the periodic input signal and the fed-back output signal, from unnecessarily causing a phase shift in the output signal. The thermometer register is coupled to a variable-delay buffer that generates the output signal based on the input signal. Output signals from the thermometer register tune the buffer such that a predetermined phase difference between the input and output signals is maintained. Because high frequency noise can cause the phase detector to err when detecting phase differences between the input signal and the output signal, the thermometer register is advantageously sensitive to preferably only long-term (i.e., multiple) indications from the phase detector that the output signal is either lagging or leading the input signal.

In one embodiment of a thermometer register according to the invention, separate register inputs receive respective signals from the phase detector indicating whether the output signal leads or lags the input signal. The thermometer register is preferably a shift register initialized with preferably logical ones in the most significant bit positions and logical zeroes in the least significant bit positions. When the register receives an indication from the phase detector that the output signal leads the input signal, the register shifts in one direction. When the phase detector indicates that the output signal lags the input signal, the register shifts in the other direction. In accordance with the preferred initialization, ones are shifted into the most significant bit position when the register shifts right, and zeroes are shifted into the least significant bit position when the register shifts left. Alternatively, of course, logical values can be reversed (i.e., zeros instead of ones and ones instead of zeros).

When the thermometer register has been shifted such that it is completely filled with ones or zeroes, it outputs a signal to the buffer indicating how the buffer should adjust the phase of the output signal with respect to the input signal. Thus, the thermometer register first filters the effects of transient noise by balancing indications that the output signal is leading the input signal with indications that the output signal is lagging the input signal.

Furthermore, phase detectors are typically of a finite granularity (i.e., phase detectors cannot detect phase differences below a finite threshold). When the delay lock loop circuit has reduced the phase difference between the output and input signals to a value at or near this threshold, further tuning of the buffer circuit is not likely to result in closer tracking of the input signal by the output signal. In those cases where the phase detector is operating close to its finite threshold, the phase detector can oscillate between indications of a leading and a lagging signal. Such oscillations can cause known delay lock loop circuits to react by alternately increasing and decreasing the delay between the output and input signals.

However, delay lock loop circuits constructed in accordance with the invention advantageously disregard phase detector oscillations. The thermometer register outputs signals indicating an advancement or a delay of the output signal only after receiving a net number of detected leading or lagging output signals. The thermometer register has to fill with either all zeroes or all ones before adjustment of the output signal occurs. Thus, delay lock loop circuits of the invention are substantially immune to phase detector oscillations.

The size (i.e., the number of bits) of the thermometer register determines its noise filtration capabilities. A large number of bits in the thermometer register causes the phase detector to detect a lagging or leading output signal for a longer period of time before the thermometer register tunes the buffer circuit accordingly. Therefore, the higher the number of bits in the thermometer register, the lower the passing frequency of the low pass filter that incorporates the thermometer register.

The initial conditions of the thermometer register (i.e., the numbers of initialized logical ones and zeroes in the register) affect the sensitivity of the low pass filter to lagging and leading output signals. For example, if logical ones correspond to a lagging output signal, the ratio of ones to zeroes that initially fill the thermometer register indicates the sensitivity of the filter to lagging output signals. If that initial ratio is one to one (e.g., five logical ones to five logical zeros) the thermometer register is equally sensitive to lagging and leading output signals. If that initial ratio is greater than one (e.g., eight logical ones to two logical zeros), the filter is more sensitive to lagging output signals. Thus, a lagging output signal will be adjusted after it has been observed for a shorter period of time than a leading output signal.

FIG. 1 shows delay lock loop circuit 100 in accordance with the invention. DLL circuit 100 is most often used to provide an output clock signal in phase with a periodic input clock or reference signal. The output clock signal is provided by variable-delay buffer 106. In one embodiment of buffer 106, the output clock signal is output from a selectable delay element of a chain of such delay elements, each providing a unit delay. Thus, to provide an output clock signal delayed by, for example, one clock cycle with respect to the input signal, buffer 106 can be tuned (i.e., the appropriate delay element selected) based on phase differences detected between the input and output signals.

Phase differences between the input signal and the output clock signal are detected by phase detector 102, which receives both input and output signals. Phase detector 102 is preferably configured to output shift right (SR) and shift left (SL) signals based on phase differences detected between the input signal and the output clock signal. The SL and SR signals indicate the relative position of the periodic output clock signal to the periodic input clock signal. If the output clock signal lags the input signal, the SL signal is asserted to indicate that the output clock signal should be shifted left (decreasing the delay between corresponding input signal transitions and output signal transitions by a unit delay). If the output clock signal leads the input clock signal, the SR signal is asserted to indicate that the output clock signal should be shifted right (increasing the delay between corresponding input signal transitions and output signal transitions by a unit delay).

In a first embodiment of phase detector 102 (not shown), a flip-flop generates SL and SR signals. The input signal clocks the flip-flop and the output clock signal is coupled to the data input of the flip-flop. An SL signal is generated in response to a logical zero flip-flop output, while an SR signal is generated in response to a logical one flip-flop output.

Figure 2:
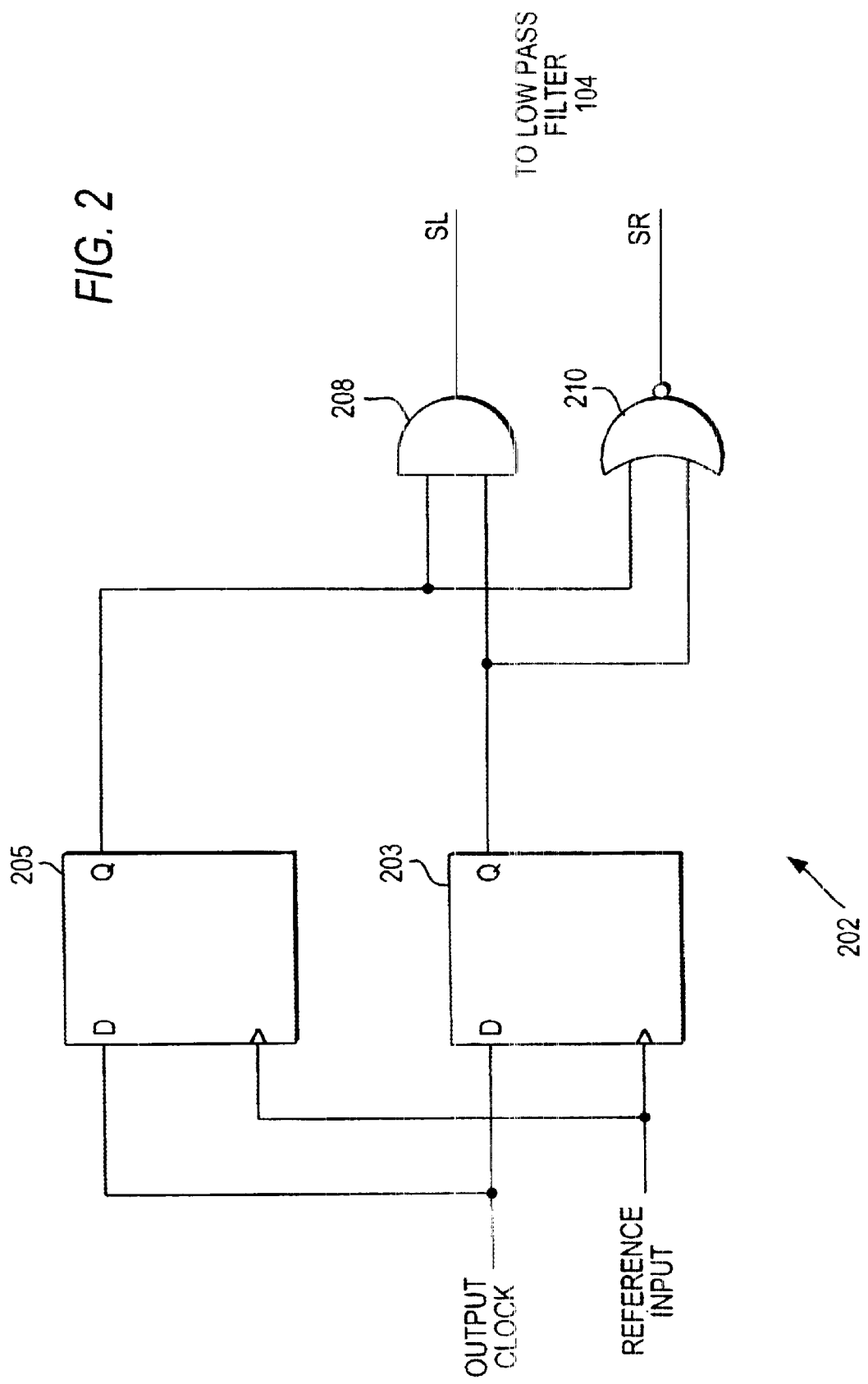
FIG. 2 is a block diagram of a preferred embodiment of a phase detector according to the invention.

FIG. 2 shows a second embodiment of phase detector 102, which is constructed with two flip-flops to preferably ensure greater stability. Phase detector 202 includes flip-flops 203 and 205 coupled to AND-gate 208 and NOR-gate 210 to generate SL and SR signals, respectively. When the output clock signal is a logical one at the rising edge of the input signal with respect to both flip-flops 203 and 205, the SR signal is asserted (e.g., logical one). When the output clock signal is a logical zero at the rising edge of the input signal with respect to both flip-flops 203 and 205, the SL signal is asserted (e.g., logical zero). Alternately, phase detector 202 can be constructed such that asserted SL and SR signals can be either a logical one or a logical zero.

Returning to FIG. 1, low pass filter 104 is coupled to phase detector 102 to receive SL and SR signals. Low pass filter 104, in accordance with the invention, provides filtered versions of SL and SR signals (i.e., SL' and SR' signals). Low pass filter 104 filters out the effects of transient noise on SL and SR signals by providing SL' and SR' signals in response to SL and SR signals received over a period of time. For example, if a number of SL signals are received over a period of time, low pass filter 104 asserts the SL' signal. The duration of that time period corresponds to the low pass frequency cutoff of low pass filter 104—the longer the time period, the lower the passing frequency of low pass filter 104.

A thermometer register is preferably included in low pass filter 104. The state of the thermometer register controls the assertion of SL' and SR' signals. The thermometer register is preferably initialized such that the most significant half of the register is set to logical ones and the least significant half is set to logical zeroes. When the register is shifted left based on an asserted SL signal, a logical zero enters its least significant bit position. When the register is shifted right based on an asserted SR signal, a logical one enters its most significant bit position. The SL' signal is asserted (e.g., set to one) when the leading logical zero of the thermometer register reaches the most significant bit position of the register. The SR' signal is asserted (e.g., set to one) when the least significant logical one of the thermometer register reaches the least significant bit position of the register. By using a thermometer register in this manner, the SL' and SR' signals are not asserted until a predetermined net number of shifts to the left or to the right, respectively, have occurred.

Figure 3:
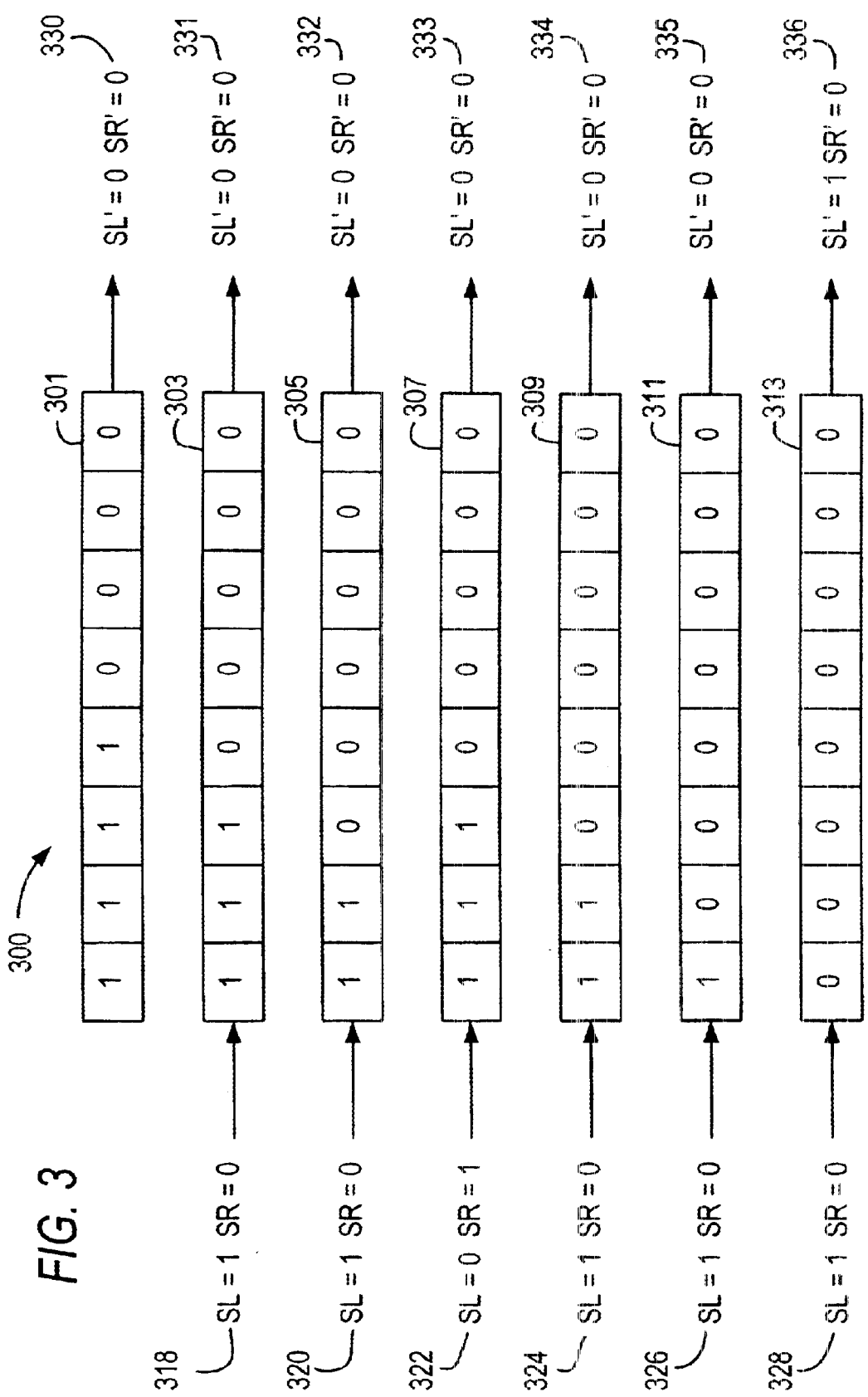
FIG. 3 is a diagram of various states of operation of a thermometer register according to the invention.

FIG. 3 illustrates the contents of an 8-bit thermometer register of low pass filter 104 at various states of operation in delay lock loop circuit 100 according to the invention. Upon power-up of delay lock loop circuit 100, the thermometer register is preferably initialized as shown in state 302. The most significant four bits of the register are initially set to logical ones and the least significant four bits of the register are initially set to logical zeroes. The thermometer register shifts left upon receiving an SL signal and shifts right upon receiving an SR signal. For example, when the thermometer register receives an SL signal as shown by inputs 318, the register shifts left with a logical zero entering its least significant bit position, as shown in state 303. When the thermometer register receives an SR signal, as shown by inputs 322, the register shifts right with a logical one entering its most significant bit position, as shown by the transition from state 305 to state 307.

Until the thermometer register completely fills with all logical zeroes or ones, neither the SL' nor the SR' signal is asserted, as shown by outputs 330–335. The leading zero in the thermometer register is initially in the 5th most significant bit position as shown in state 301. It reaches the most significant bit position in the register as shown in state 313 after four net shifts to the left. When the leading zero is in the most significant bit position, the SL' signal is asserted as shown by output 336. A possible sequence of shifts that places the leading zero in the most significant bit position is shown in FIG. 3.

Alternatively, of course, the thermometer register can be initialized and constructed to operate conversely.

After the thermometer register has asserted an SL' or SR' signal as appropriate, the register in one embodiment resets to its initial conditions. In another embodiment, the register maintains its full logical one or full logical zero state (e.g., state 313) and continues operating as described.

Figure 4:
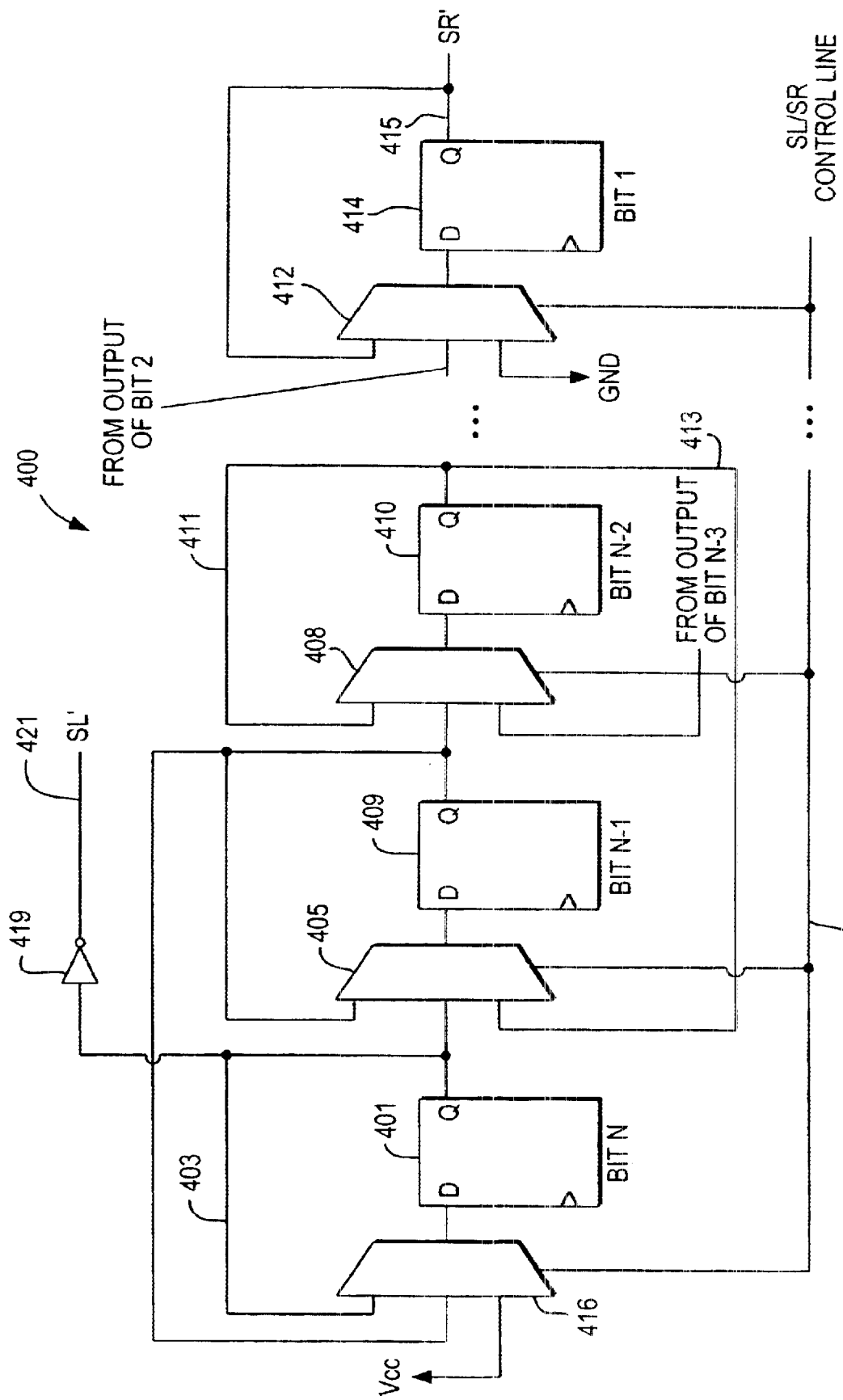
FIG. 4 is a diagram of a preferred embodiment of a thermometer register according to the invention.

FIG. 4 shows an embodiment of a thermometer register in accordance with the invention. Thermometer register 400 includes N flip-flops 401, 409, 410, and 414 coupled to each other and responsive to SL and SR signals. Bit N, the most significant bit of register 400, is implemented in flip-flop 401. When an SL signal is asserted, the value of bit N−1 is shifted into bit N via output 407. When an SR signal is asserted, a logical one (shown as Vcc) is shifted into bit N. Vcc is a suitable voltage reference that supplies a logical one. When the input signal and the output clock signal are in phase according to phase detector 102, neither the SL signal nor the SR signal is asserted. In this case, the current value of bit N remains in flip-flop 402 by being fed back via output 403. Multiplexer 416 receives a control signal via SL/SR control line 417 to selectively couple one of bit N, bit N−1, or a logical one (Vcc) to flip-flop 401 in accordance with an asserted SR or SL signal. The least significant bit of thermometer register 400 is represented by flip-flop 414. Multiplexer 412 selects and outputs to flip-flop 414 either bit 2 if an SR signal is asserted, bit 1 if neither an SL or SR signal is asserted, or GND (or another suitable voltage reference for supplying a logical zero) if an SL signal is asserted.

For bits other than the least or most significant bits of thermometer register 400, respective multiplexers (e.g., multiplexers 405 and 408) select the value for each bit based on the signal received via control line 417. For example, if an SL signal is asserted, the value of bit N−2 at flip-flop 410 is shifted into bit N−1 at flip-flop 409 via output 413, and the value of bit N−3 is shifted into flip-flop 410. When an SR signal is asserted, the value of bit N−1 is shifted into bit N−2. If neither an SL signal nor an SR signal is asserted, the value of bit N−2 is retained by that value being shifted back into flip-flop 410 via output 411. Multiplexer 408 selectively couples one of bits N−1, N−2, or N−3 to flip-flop 410.

Thermometer register 400 is coupled to variable-delay buffer 106 via SL' output line 421 and SR' output line 415. A logical one SL' signal is output when a logical zero reaches flip-flop 401 and is fed through inverter 419. A logical one SR' signal is output when a logical one reaches flip-flop 414.

Alternatively, digital circuitry other than the thermometer register of the invention can be used in low pass filter 104 provided it performs the same or equivalent function. For example, a digital circuit appropriately constructed to separately count lead and lag signals received from a phase detector, subtract those sums to determine a lead or lag signal difference, and then compare that difference against an appropriate lead or lag signal count threshold can be used. Another appropriately constructed digital circuit that can be used includes an accumulator circuit preferably initialized to its midpoint value. The accumulator is then appropriately decremented or incremented as lead and lag signals are received. Upon the accumulator reaching its minimum or maximum value, an appropriate shift signal is output.

Figure 5:
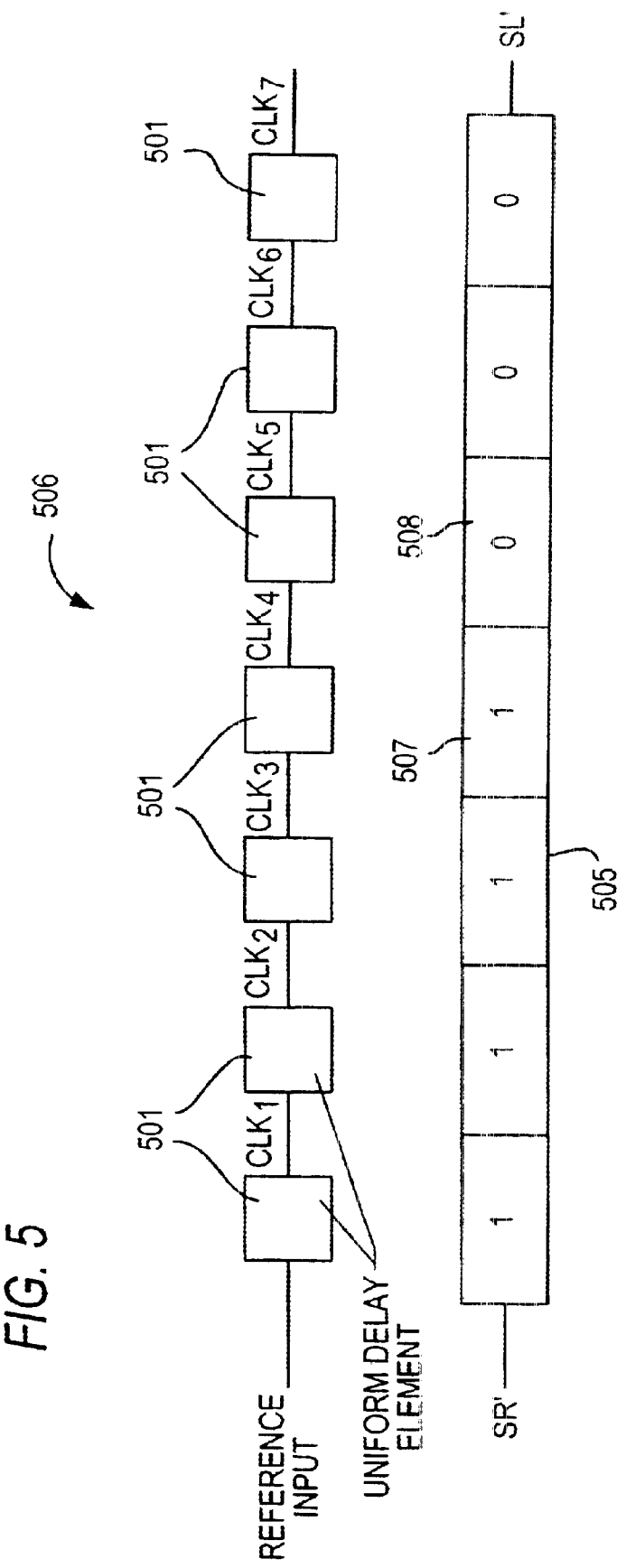
FIG. 5 is a high-level block diagram of a variable-delay buffer that can be used in a delay lock loop circuit of the invention.

FIG. 5 shows an embodiment of variable-delay buffer 106. Buffer 506 includes shift register 505 and several uniform delay elements 501. The input signal is coupled to the first uniform delay element 501, and the output clock signal can be provided by any one of the outputs of delay elements 501 subject to the state of shift register 505. The number of delay elements 501 corresponds to the number of bits of shift register 505. Control logic detects the transition point between logical ones and zeroes in shift register 505 and determines which delay element 501 provides the output clock signal.

Shift register 505 is responsive to SL' and SR' signals received from thermometer register 400. In this embodiment, shift register 505 has logical ones in its four most significant bit positions and logical zeroes in its three least significant bit positions. In this state, the transition point between ones and zeroes occurs after the 4th most significant bit position. This causes the output clock signal to incur four units of delay before being output as $CLK_4$.

Figure 6:
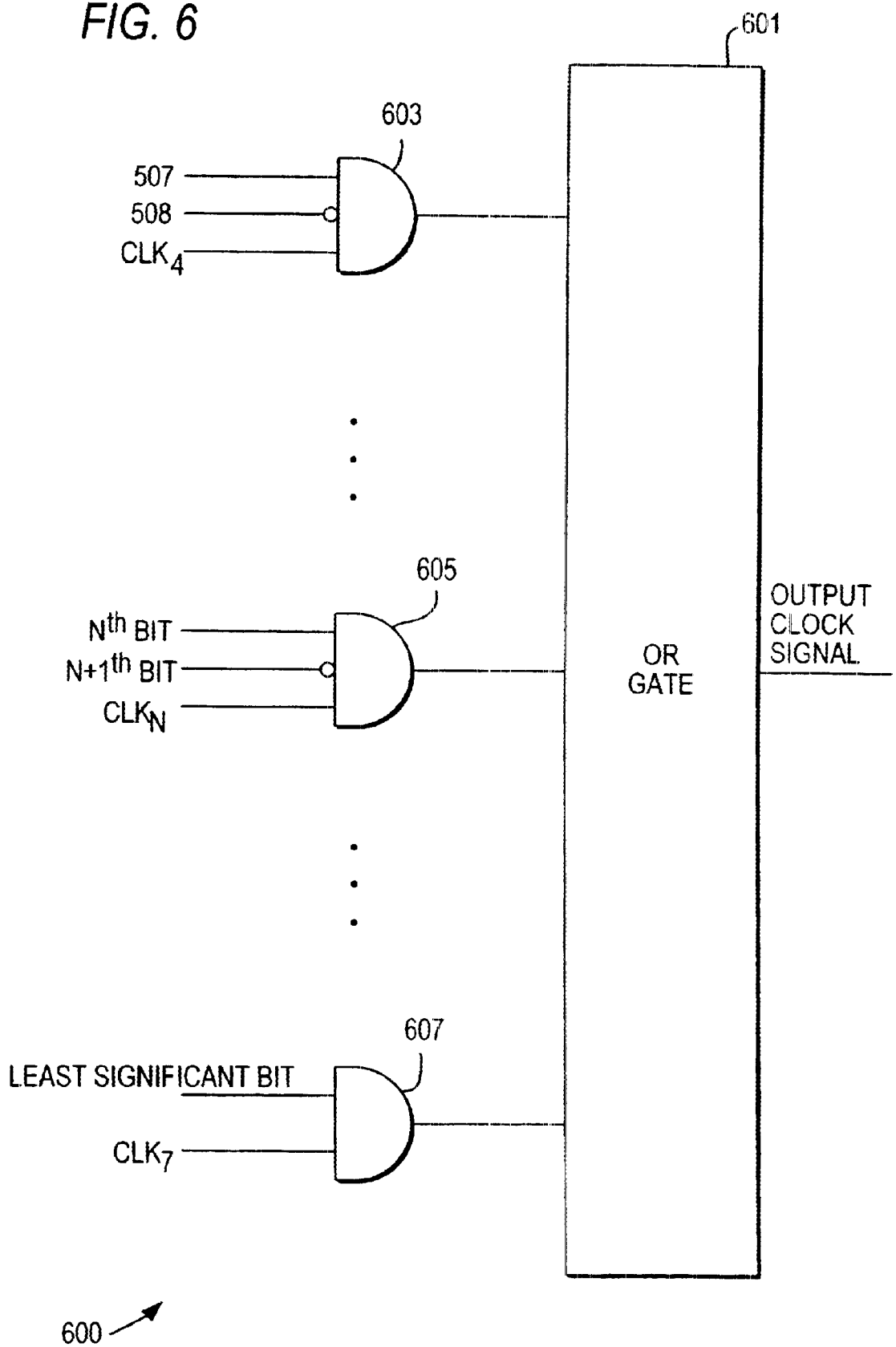
FIG. 6 is a high-level block diagram of multiplexing circuitry that can be used with the variable-delay buffer of FIG. 5.

FIG. 6 shows an embodiment of control logic that detects the transition between ones and zeroes in shift register 505. Signals representing the values of bits 507 and 508 of shift register 505 are coupled to logic gate 603 along with clock signal $CLK_4$. Similarly, clock signal $CLK_N$ (which is representative of the other clock signals of buffer 506) and signals representing the values of bits N and N+1 from shift register 505 are also coupled to logic gates, as represented by logic gate 605. $CLK_7$ is selected by testing for the presence of a logical one in the least significant bit position of shift register 505 (e.g., with AND-gate 607). The output clock signal is determined by feeding the outputs of logic gates 603, . . . , 605, and 607 into OR-gate 601.

Thus it is seen that a versatile, compact low pass filter for digital delay lock loop circuits is provided that can reduce, if not prevent, the adverse effects of transient noise on phase detector inputs, thus better maintaining the phase relationship between an input reference signal and a generated output signal. One skilled in the art will appreciate that the present invention can be practiced by other than the described embodiments, which are presented for purposes of illustration and not of limitation, and the present invention is limited only by the claims which follow.

I claim:

1. A method of maintaining a predetermined phase relationship between a periodic output signal and a periodic input signal, said method comprising:

receiving signals sequentially, each said received signal indicating a phase difference outside said phase relationship between said output signal and said input signal;

counting each said received signal; and generating a signal indicating that a shift in the phase of said output signal be made to reestablish said phase relationship in response to a count threshold being reached, said count threshold greater than one.

2. The method of claim 1 wherein said receiving comprises receiving signals sequentially, each said received signal indicating a phase difference outside said phase relationship between said output signal and said input signal, said phase difference selected from the group consisting of a lagging phase difference and a leading phase difference.

3. The method of claim 2 wherein said counting comprises:

counting said received signals indicating a lagging phase difference;

counting said received signals indicating a leading phase difference; and taking the difference between said counted signals indicating a lagging phase difference and said counted signals indicating a leading phase difference.

4. The method of claim 3 wherein said generating comprises generating a signal indicating that a shift in the phase of said output signal be made to reestablish said phase relationship in response to said difference reaching said threshold.

5. The method of claim 3 wherein:

said count threshold comprises a net leading count threshold and a net lagging count threshold, each said threshold greater than one; and said generating comprises:

generating a first signal indicating that a shift increasing the phase of said output signal be made to reestablish said phase relationship in response to said difference reaching one of said lagging phase count threshold and said leading phase count threshold; and generating a second signal indicating that a shift decreasing the phase of said output signal be made to reestablish said phase relationship in response to said difference reaching the other of said lagging phase count threshold and said leading phase count threshold.

6. A method of maintaining a predetermined phase relationship between a periodic output signal and a periodic input signal, said method comprising:

receiving said input signal;

generating said output signal having said phase relationship with said input signal;

detecting whether a phase difference outside said phase relationship has occurred between said output signal and said input signal;

shifting a bit into a shift register in response to detecting said phase difference outside said phase relationship; and adjusting the phase of said output signal to reestablish said phase relationship only in response to said shift register having all shift register bits of a same logical binary value.

7. The method of claim 6 wherein said phase relationship comprises a zero phase difference between said output signal and said input signal.

8. The method of claim 6 wherein said detecting comprises comparing the phase of said output signal with the phase of said input signal to determine whether a phase difference outside said phase relationship has occurred.

9. The method of claim 6 wherein said detecting comprises detecting whether a phase difference selected from the group consisting of a leading phase difference and a lagging phase difference outside said phase relationship has occurred between said output signal and said input signal.

10. The method of claim 6 further comprising:

initializing the most significant bits of said shift register to a same logical binary value, said most significant bits representing half of all bits in said shift register; and initializing the least significant bits of said shift register to the other logical binary value, said least significant bits representing the other half of all bits in said shift register.

11. The method of claim 6 wherein said shifting comprises:

shifting in a first direction into a shift register a bit having a logical binary value in response to detecting an output signal having a lagging phase difference; and shifting in a second direction opposite said first direction into a shift register a bit having the other logical binary value in response to detecting an output signal having a lagging phase difference.

12. The method of claim 6 wherein said adjusting comprises:

increasing a delay between a transition of said output signal and a corresponding transition of said input signal to reestablish said phase relationship in response to said shift register having all shift register bits of a same logical binary value; and decreasing said delay between said transition of said output signal and said corresponding transition of said input signal to reestablish said phase relationship in response to said shift register having all shift register bits of the other logical binary value.

13. The method of claim 12 wherein said transition comprises a transition from a logical zero to a logical one.

14. A method of maintaining a periodic output signal in phase with a periodic input signal, said method comprising:

receiving said input signal;

generating said output signal in phase with said input signal;

detecting whether a phase difference has occurred between said output signal and said input signal;

shifting a bit into a shift register in response to detecting said phase difference; and adjusting the phase of said output signal such that said output and input signals are in phase only in response to said shift register having all shift register bits of a same logical binary value.

15. The method of claim 14 wherein said output and input signals are in phase when logic transitions of each of said output and input signals occur at substantially the same time.

16. A method of maintaining a predetermined phase relationship between a periodic output signal and a periodic input signal, said method comprising:

receiving said input signal;

generating said output signal having said phase relationship with said input signal;

detecting whether a phase difference outside said phase relationship has occurred between said output signal and said input signal;

generating a first signal in response to detecting said output signal with a leading phase difference outside said phase relationship;

generating a second signal in response to detecting said output signal with a lagging phase difference outside said phase relationship; and adjusting the phase of said output signal to reestablish said phase relationship in response to generating one of said first and second signals a predetermined number of times more than the other of said first and second signals, said predetermined number greater than one.

17. A method of maintaining a predetermined phase relationship between a periodic output signal and a periodic input signal, said method comprising:

receiving said input signal;

generating said output signal having said phase relationship with said input signal;

detecting whether a phase difference selected from the group consisting of a leading phase difference and a lagging phase difference has occurred outside said phase relationship between said output signal and said input signal; and adjusting the phase of said output signal to reestablish said phase relationship in response to detecting one of said leading and lagging phase differences a predetermined number of times more than the other of said leading and lagging phase differences, said predetermined number greater than one.

18. A delay lock loop circuit comprising:

a phase detector having a first input operative to receive a periodic reference signal, a second input, and an output, said detector operative to detect phase differences between respective periodic signals received at said first and second inputs;

a thermometer register having an input and an output, said register input coupled to said phase detector output, said register providing an output signal in response to all bits of said register having a same logical binary value; and a variable-delay buffer having a first input operative to receive said reference signal, a second input coupled to said register output, a plurality of delay elements, and an output operative to provide an output signal, said output signal coupled to said second input of said phase detector, said buffer operative to select a delay with respect to said reference signal at which to output said output signal in response to said register output signal.

19. The delay lock loop circuit of claim 18 wherein said phase detector is further operative to detect whether said buffer output signal is leading or lagging said reference signal.

20. The delay lock loop circuit of claim 18 wherein said phase detector comprises a flip-flop clocked by said reference signal, said flip-flop coupled to receive said buffer output signal and providing an output signal indicative of whether said buffer output signal is leading or lagging said reference signal.

21. The delay lock loop circuit of claim 18 wherein said thermometer register comprises a shift register.

22. The delay lock loop circuit of claim 18 wherein:

the most significant bits of said thermometer register are initialized to a same logical binary value, said most significant bits representing half of all bits in said thermometer register; and the least significant bits of said thermometer register are initialized to the other logical binary value, said least significant bits representing the other half of all bits in said thermometer register.

23. The delay lock loop circuit of claim 22 wherein:

said most significant bits are initialized to logical ones; and said least significant bits are initialized to logical zeros.

24. The delay lock loop circuit of claim 18 wherein:

said thermometer register is shifted in a first direction in response to a phase detector output signal indicating a lagging buffer output signal; and said thermometer register is shifted in a second direction opposite said first direction in response to a phase detector output signal indicating a leading buffer output signal.

25. The delay lock loop circuit of claim 24 wherein:

said shift in a first direction comprises shifting in a bit having a logical binary value; and said shift in a second direction comprises shifting in a bit having the other logical binary value.

26. The delay lock loop circuit of claim 18 wherein said register output signal comprises:

a first register output signal indicating that said delay should be increased; and a second register output signal indicating that said delay should be decreased.

27. The delay lock loop circuit of claim 18 wherein said register output signal comprises:

a first register output signal that is output in response to said thermometer register having all logical ones; and a second register output signal that is output in response to said thermometer register having all logical zeroes.

28. The delay lock loop circuit of claim 18 wherein said buffer output signal is a clock signal.

29. A delay lock loop circuit that maintains a predetermined phase relationship between a periodic input signal and a periodic output signal comprising:

a phase detector having a first input operative to receive said input signal, a second input operative to receive said output signal, and two outputs, said detector generating a first signal at said first output in response to detecting said output signal with a leading phase difference outside said phase relationship and generating a second signal at said second output in response to detecting said output signal with a lagging phase difference outside said phase relationship;

means for determining the number of said generated first and second signals, said means generating a third signal in response to said first signal being greater than said second signal by a first predetermined number and generating a fourth signal in response to said second signal being greater than said first signal by a second predetermined number; and a variable-delay buffer coupled to said means, said buffer adjusting the phase of said output signal in response to receiving one of said third and fourth signals.

30. The delay lock loop circuit of claim 29 wherein:

said third signal causes said buffer to adjust said phase by increasing a delay between said input and output signals; and said fourth signal causes said buffer to adjust said phase by decreasing a delay between said input and output signals.

31. Apparatus for maintaining a predetermined phase relationship between a periodic output signal and a periodic input signal, said apparatus comprising:

means for receiving signals sequentially, each said received signal indicating a phase difference outside said phase relationship between said output signal and said input signal;

means for counting each said received signal; and means for generating a signal indicating that a shift in the phase of said output signal be made to reestablish said phase relationship in response to a count threshold being reached, said count threshold greater than one.

32. Apparatus for maintaining a predetermined phase relationship between a periodic output signal and a periodic input signal, said apparatus comprising:

means for receiving said input signal;

means for generating said output signal having said phase relationship with said input signal;

means for detecting whether a phase difference outside said phase relationship has occurred between said output signal and said input signal;

means for shifting a bit into a shift register in response to detecting said phase difference outside said phase relationship; and means for adjusting the phase of said output signal to reestablish said phase relationship, said means for adjusting responding only to said shift register having all shift register bits of a same logical binary value.

33. Apparatus for maintaining a periodic output signal in phase with a periodic input signal, said apparatus comprising:

means for receiving said input signal;

means for generating said output signal in phase with said input signal;

means for detecting whether a phase difference has occurred between said output signal and said input signal;

means for shifting a bit into a shift register in response to detecting said phase difference; and means for adjusting the phase of said output signal such that said output and input signals are in phase, said means for adjusting responding only to said shift register having all shift register bits of a same logical binary value.

34. Apparatus for maintaining a predetermined phase relationship between a periodic output signal and a periodic input signal, said apparatus comprising:

means for receiving said input signal;

means for generating said output signal having said phase relationship with said input signal;

means for detecting whether a phase difference outside said phase relationship has occurred between said output signal and said input signal;

means for generating a first signal in response to detecting said output signal with a leading phase difference outside said phase relationship;

means for generating a second signal in response to detecting said output signal with a lagging phase difference outside said phase relationship; and means for adjusting the phase of said output signal to reestablish said phase relationship in response to generating one of said first and second signals a predetermined number of times more than the other of said first and second signals, said predetermined number greater than one.

35. Apparatus for maintaining a predetermined phase relationship between a periodic output signal and a periodic input signal, said apparatus comprising:

means for receiving said input signal;

means for generating said output signal having said phase relationship with said input signal;

means for detecting whether a phase difference outside said phase relationship selected from the group consisting of a leading phase difference and a lagging phase difference has occurred between said output signal and said input signal; and means for adjusting the phase of said output signal to reestablish said phase relationship in response to detecting one of said leading and lagging phase differences a predetermined number of times more than the other of said leading and lagging phase differences, said predetermined number greater than one.

* * * * *